United States Patent
Wappis et al.

(10) Patent No.: US 12,368,413 B2
(45) Date of Patent: Jul. 22, 2025

(54) CIRCUIT AND METHOD FOR BIASING A TRANSISTOR AND CORRESPONDING DEVICE

(71) Applicant: Infineon Technologies AG, Neubiberg (DE)

(72) Inventors: Herwig Wappis, Villach (AT); Peter Singerl, Villach (AT); Martin Mataln, Rosegg (AT); Gerhard Maderbacher, Gleisdorf (AT)

(73) Assignee: Infineon Technologies AG, Neubiberg (DE)

( * ) Notice: Subject to any disclaimer, the term of this patent is extended or adjusted under 35 U.S.C. 154(b) by 108 days.

(21) Appl. No.: 18/172,008

(22) Filed: Feb. 21, 2023

(65) Prior Publication Data

US 2023/0283243 A1 Sep. 7, 2023

(30) Foreign Application Priority Data

Mar. 2, 2022 (EP) .................... 22159753

(51) Int. Cl.
*G05F 3/02* (2006.01)
*G05F 3/20* (2006.01)
*H03F 1/02* (2006.01)
*H03F 1/30* (2006.01)
*H03K 19/0175* (2006.01)
*H03M 1/06* (2006.01)

(52) U.S. Cl.
CPC ............. *H03F 1/302* (2013.01); *G05F 3/205* (2013.01); *H03F 1/0266* (2013.01); *H03K 19/0175* (2013.01); *H03M 1/0604* (2013.01)

(58) Field of Classification Search
CPC ... G05F 3/02; G05F 3/08; G05F 3/205; H03F 1/301; H03F 1/302; H03F 1/0266; H03K 19/0175; H03K 19/0185; H03M 1/0604
See application file for complete search history.

(56) References Cited

U.S. PATENT DOCUMENTS

2013/0321086 A1* 12/2013 Iizuka ................ H03F 3/19
 330/296
2019/0058448 A1* 2/2019 Seebacher ............. H04B 1/401

FOREIGN PATENT DOCUMENTS

CN 113839624 A 12/2021
EP 1873906 A2 1/2008
WO 2012111451 A1 8/2012

OTHER PUBLICATIONS

Fang, Wen-Rao et al., "X-Band High-Efficiency High-Power GaN Power Amplifier Based on Edge-Triggered Gate Modulation", IEEE Microwave and Wireless Components Letters, vol. 30, No. 9, Sep. 2020, 4 pages.

* cited by examiner

Primary Examiner — Long Nguyen
(74) Attorney, Agent, or Firm — Slater Matsil, LLP

(57) ABSTRACT

A circuit for biasing a transistor is provided. The circuit includes an output terminal configured to be coupled to a gate terminal of the transistor and circuitry. In a first state, the circuitry is configured to output a control signal at a first voltage level for setting the transistor to a first transistor state. In a second state, the circuitry is configured to first output the control signal at a second voltage level different from the first voltage level following by changing the control signal from the second voltage level towards a third voltage level different from the first and second voltage level over time.

21 Claims, 3 Drawing Sheets

CIRCUIT AND METHOD FOR BIASING A TRANSISTOR AND CORRESPONDING DEVICE

This application claims the benefit of European Patent Application No. 22159753, filed on Mar. 2, 2022, which application is hereby incorporated herein by reference.

TECHNICAL FIELD

The present application relates to circuits and methods for biasing a transistor as well as to devices including such a circuit and the corresponding transistor.

BACKGROUND

In various applications, transistors are biased with a certain voltage, to set an operating point for the transistor. An example of such an application is the use of transistors as amplifiers for an AC (alternating current) signal. In such applications, by a DC (direct current) biasing voltage, the transistor is set to an operating point, for example in a linear region of the transistor. Then, additionally the AC signal is applied to the transistor, and a current through the transistor is modulated according to the AC signal. An example for such an AC signal is an RF (radio frequency) signal used in communication applications.

In some of these applications, it may be required to switch the transistor between a first transistor state, where the transistor is essentially inactive (switched off or biased to have a reduced current) and a second transistor state where the transistor is biased at its operating point as mentioned above. An example is time division duplexing (TDD) used in communication standards like 5G, where during time slots where a signal is received by a communication device the transistor of an amplifier is set to the first transistor state, i.e. inactive state, in order not to disturb the received signal. For transmitting signals in other time slots the transistor is set to the second transistor state for example to amplify a signal to be transmitted.

In order to amplify the AC signal in a reproducible manner, the current through the transistor at the operating point set in the second transistor state, without applied signal to be amplified, should be the same every time the transistor is switched to the second state. However, due to effects like charge trapping or, immediately after transitioning to the second transistor state a different, for example lower current may result and only after some time the actually desired nominal current flows. Also, other effects like self-heating may influence the current. For example, in communication this may lead to a distortion of sent symbols and therefore to communication errors.

This effect may be particularly pronounced for wide bandgap material transistors like Gallium Nitride based high electron mobility transistors (GaN HEMTs), but may also occur in other transistor types. One conventional solution is to, in the first state, turn the transistor off as little as possible (or in other words not fully turn off the transistor), which may reduce trapping effects. However, this may increase noise. Another solution is predistorting the signal to be amplified, which requires additional signal processing.

SUMMARY

A circuit as defined in claim 1 and a method as defined in claim 14 are provided. The dependent claims define further embodiments as well as a device including such a circuit.

According to an embodiment, a circuit for biasing a transistor is provided, comprising:
an output terminal configured to be coupled to a control terminal of the transistor, and
circuitry configured to selectively:
in a first state, output a control signal having a first voltage level at the output terminal for setting the transistor to a first transistor state, or
in a second state, output the control signal at the output terminal for setting the transistor to a second transistor state by first outputting the control signal at a second voltage level different from the first voltage level followed by changing the control signal from the second voltage level towards a third voltage level different from the first and second voltage levels over time,
wherein the circuit is configured to select a difference between the second voltage level and the third voltage level based on at least one of a time duration of the first state prior to the second state or the first voltage level.

According to another embodiment, a method for biasing a transistor is provided, comprising, selectively:
in a first state, outputting a control signal to a control terminal of the transistor at a first voltage level for setting the transistor to a first transistor state, or
in a second state, for setting the transistor to a second transistor state first outputting the control signal at a second voltage level different from the first voltage level followed by changing the control signal from the second voltage level to a third voltage level different from the first and second voltage levels over time,
the method further comprising selecting a difference between the second voltage level and the third voltage level based on at least one of a time duration of the first state prior to the second state or the first voltage level.

The above summary merely provides a brief overview over some embodiments and is not to be construed as limiting in any way, as other embodiments may include different features from the ones explicitly mentioned above.

DETAILED DESCRIPTION OF ILLUSTRATIVE EMBODIMENTS

In the following various embodiments will be described in detail referring to the attached drawings. These embodiments are given by way of example only and are not to be construed as limiting. For example, while embodiments are shown comprising certain features (components, elements, devices, acts, events, method steps), in other embodiments some of these features may be omitted or replaced by alternative features. Features from different embodiments may be combined unless noted otherwise. Variations and modifications described for one of the embodiments are also applicable to other embodiments and will therefore not be described repeatedly.

Connections and couplings described herein refer to electrical connections or couplings unless noted otherwise. Such connections or couplings may be modified, for example by removing elements or by providing additional intervening elements as long as the general purpose of the connection or coupling, for example to provide a certain signal, a certain voltage, a certain control or the like, is not significantly altered.

Transistors generally will be described as including a control terminal and two load terminals (first and second load terminal) herein. By applying a control signal to the control terminal of the transistor, for example a resistance between the load terminals, a current flowing via the load terminals and/or an operating point of the transistor may be set. The term transistor, as used herein, includes various types of transistors like field effect transistors (FETs), bipolar junction transistors (BJTs) or isolated gate bipolar transistors (IGBTs). In case of a field effect transistor, the control terminal corresponds to the gate terminal, and the load terminals correspond to the source and drain terminals. In case of a bipolar junction transistor, the control terminal corresponds to the base terminal, and the load terminals correspond to the collector and emitter terminals. In case of an IGBT, the control terminal corresponds to the gate terminal, and the load terminals correspond to the collector and emitter terminals.

Field effect transistors may include various subtypes like metal oxide semiconductor field effect transistors (MOSFETs), high electron mobility transistors (HEMTs) and the like. Transistors may be based on various semiconductor materials, like group IV materials including Silicon, Germanium, Carbon and compounds thereof like SiGe or SiC, or III-V semiconductors like Gallium Arsenide (GaAs) or Gallium Nitride (GaN). While in some embodiments described below specific transistor types are used, it is to be understood that the concepts for biasing transistors discussed herein may also be applied to other transistor types.

Figure 1:
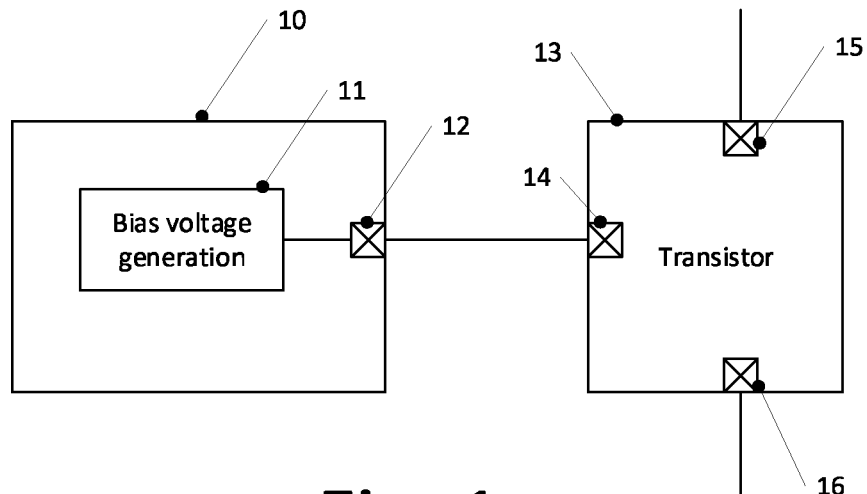
FIG. 1 is a block diagram of a device according to an embodiment.

Turning now to the Figures, FIG. 1 is a block diagram illustrating a device according to an embodiment.

The device of FIG. 1 includes a transistor 13 and a circuit 10 for biasing transistor 13.

Circuit 10 includes an output terminal 12 coupled to a control terminal 14 of transistor 13. Furthermore, transistor 13 includes a first load terminal 15 and a second load terminal 16. In operation, for example, one of the load terminals 15, 16 may be coupled to a load. In some applications, transistor 13 may operate as an amplifier or part of an amplifier. In this case, circuit 10 may be used to set an operating point of transistor 13, and additionally a signal to be amplified (not shown in FIG. 1, but explained further below with reference to FIG. 6 for a specific example) may be applied to control terminal 14, modifying for example a current flowing between load terminals 15, 16.

Circuit 10 includes bias voltage generation circuitry 13 which provides a control signal to output terminal 12 and therefore to control terminal 14 of transistor 13. The operation of bias voltage generation circuitry 11 will be explained referring to FIG. 2.

Figure 2:
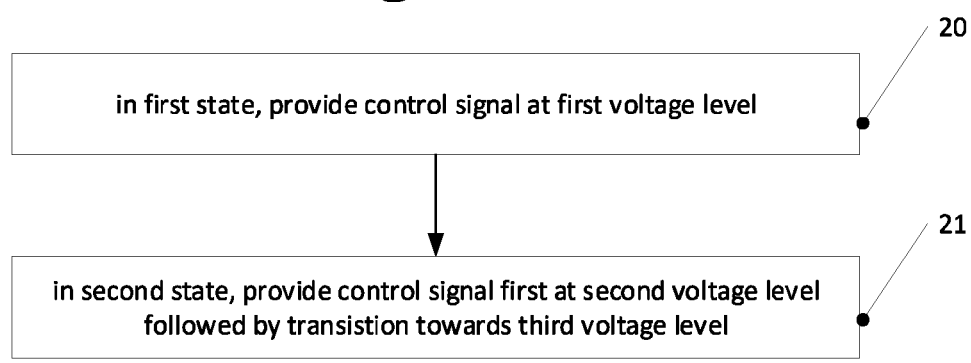
FIG. 2 is a flowchart illustrating a method according to some embodiments.

FIG. 2 is a flowchart illustrating a method according to some embodiments, which may be implemented using circuit 10 and bias voltage generation circuitry 11 of FIG. 1, but which may also be implemented using other devices. However, for ease of illustration the method of FIG. 2 will be explained using the device of FIG. 1.

At 20, the method comprises, in a first state, providing a control signal at a first voltage level to a transistor. In case of FIG. 1, this means that bias voltage generation circuitry 11 in the first state provides a control signal at the first voltage level via output terminal 12 to control terminal 14 of transistor 13. The control signal at the first voltage level sets transistor 13 to a first transistor state. The first transistor state may be an inactive state, where transistor 13 is not used. In this inactive state, transistor 13 may be switched off (i.e., essentially non-conducting between load terminals 15, 16) or at least to a state with a high impedance between control terminals 15, 16, even if not fully switched off. For example, when transistor 13 is used as an amplifier in a communication system for signals to be transmitted, using a time division duplexing scheme, the first state may be assumed in times where the communication device receives data and therefore transistor 13 is not used. By setting transistor 13 to the first transistor state, disturbances caused by transistor 13 in a receive path for receiving signals may be reduced.

At 21, the method comprises, in a second state, providing the control signal first at a second voltage level followed by a change towards a third voltage level, where the second and third voltage levels differ from each other and differ from the first voltage level. By the control signal in the second state, transistor 13 may be set to a second transistor state, for example an active state where transistor 13 is used and set to a certain operation point. In the above mentioned communication application example, the second state may correspond to a state where transistor 13 is used to amplify signals to be transmitted.

The second voltage level and the transition towards the third voltage level is selected to at least partially compensate effects as described in the introductory portion, for example trapping effects or self-heating effects. The third voltage level may be a stationary state, for example after trapping effects have become negligible after switching to the second state. The third voltage level, for example then may ensure a certain operating current between load terminals 15, 16. When after the second state again the device switches to the first state and then to the second state again, the second voltage level ensures that the same current flows immediately after switching the transistor 13 to the second transistor state as in the stationary state at the third voltage level. In this way, effects like trapping effects or self-heating effects may at least be reduced.

For example, in case transistor 13 is an N-type field effect transistor, the second voltage level may be higher than the third voltage level, to compensate trapping effects, and both the second and third voltage level may be above the first voltage level. Conversely, in case of a P-type transistor, the second voltage level may be below the third voltage level, and both the second and third voltage levels may be below the first voltage level. In both cases, the third voltage level is between the first and second voltage levels. In other cases, however, the second voltage level may be between the first voltage level and the third voltage level, for example in some cases of n-type transistors, when without the techniques discussed herein the drain current would be higher than intended immediately after switching to the second transistor state (instead of lower as in the example above).

Transition "towards" the third voltage level means that the third voltage level is reached after a certain time. However, depending on the operation, it may happen that the transistor 13 has to be switched to the first transistor state again before the third voltage level is actually reached.

For further illustration, the techniques described generally with respect to FIGS. 1 and 2 will now be described using a particular implementation and example signals in this particular implementation. However, this is to be understood as an example, hence other implementations are also possible.

Figure 3:
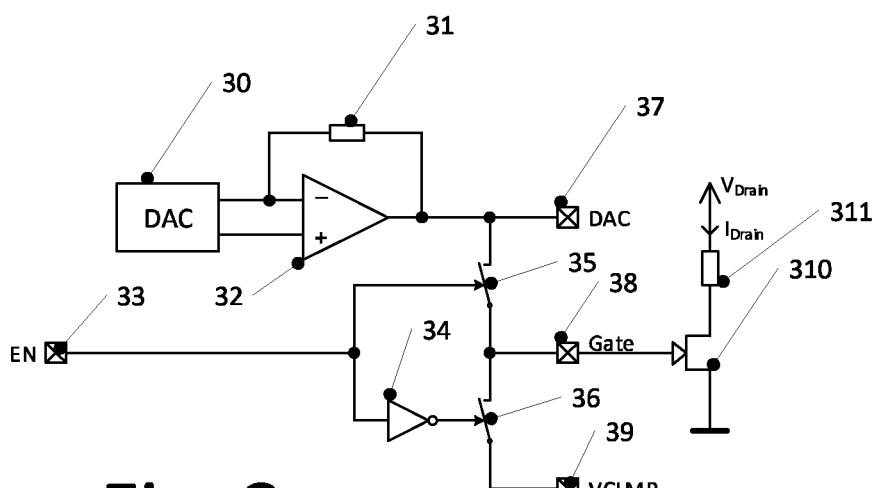
FIG. 3 is a circuit diagram of a device according to an embodiment.

FIG. 3 is a circuit diagram illustrating a device according to a further embodiment. The device of FIG. 3 includes a circuit, including elements 30 to 39, for biasing a transistor 310. In the example of FIG. 3, transistor 310 is an N-type field effect transistor. In a particular embodiment, for example usable for high-speed communication applications, transistor 310 may be a Gallium Nitride (GaN)-based high electron mobility transistor (HEMT). A drain terminal of transistor 310 is coupled to a voltage $V_{Drain}$ via a load 311, represented as an impedance. A current flowing via load 311 is labelled $I_{Drain}$ in FIG. 3.

Circuit 30 to 39 is shown as including 4 terminals, an enable terminal 33 to receive an enable signal EN, a clamp voltage terminal 39 to receive a clamping voltage VCLMP, an output terminal 38 to output a control signal (Gate) to a gate terminal of transistor 310, and a terminal 37 where an output of a digital to analog converter 30 may be tapped via a buffer including a differential amplifier 32 and a feedback resistor 31 as shown.

The circuit furthermore, comprises two switches 35, 36 provided in a half bridge like configuration. A node between switches 35, 36 is coupled to output terminal 38. Switches 35, 36 may be implemented as transistor switches in any conventional manner.

Switch 35 in the example of FIG. 3 is directly controlled by enable signal EN while switch 36 is controlled by enable signal EN via an inverter 34, such that always one of switches 35, 36 is closed and the other one of switches 35, 36 is open.

In the first state corresponding to the first state above, enable signal EN controls switches 35, 36 such that switch 36 is closed and switch 35 is open. Therefore, transistor 310 is biased by voltage VCLMP. Voltage VCLMP sets transistor P110 to an inactive state, for example a switched off state or a state with high impedance between source and drain terminals and therefore a reduced drain current $I_{Drain}$.

Signal EN may be received from another entity, for example a controller controlling an operation of a communication system like a time division duplexing operation, or another controller controlling operation of a system in which the device shown in FIG. 3 is used.

In the second state, enable signal EN controls switch 35 to be closed and switch 36 to be opened, such that an output signal of digital to analog converter 30 via buffer 31, 32 is provided to output terminal 38 and therefore to the gate terminal of transistor 310. Digital to analog converter 30 may be any type of digital to analog converter (DAC), for example a resistive DAC. Digital to analog converter 30 is provided with a sequence of digital values providing a desired second voltage level followed by a transition towards a third voltage level, as explained with respect to 21 of FIG. 2, to transistor 310.

By using switches 35, 36, a fast transition between the first and second state is possible. However, in other embodiments where a sufficiently fast digital to analog converter 30 is used, also the voltage level for the first state (VCLMP in FIG. 3) may be generated by the digital to analog converter. In this case, no switching circuitry as for example switches 35, 36 is needed.

Figure 4:
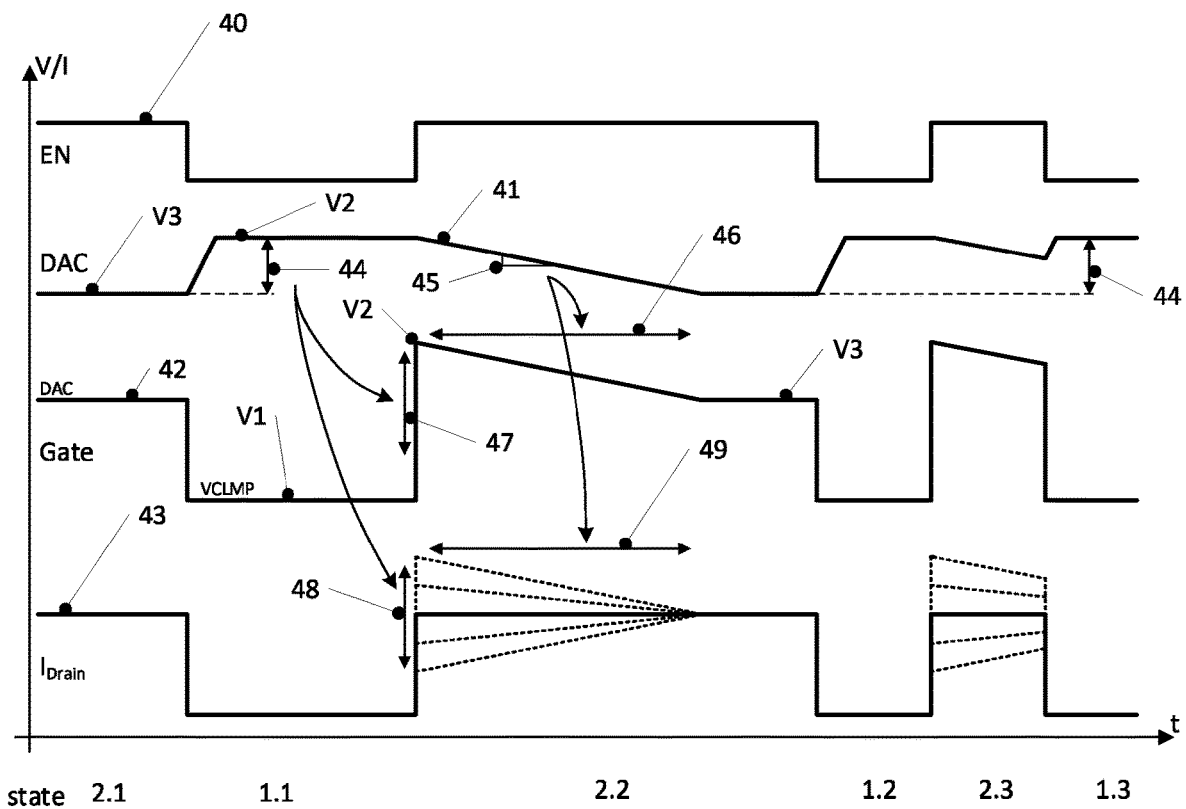
FIG. 4 is a diagram illustrating example signals for the embodiment of FIG. 3.

To further illustrate this, FIG. 4 shows example signals for the embodiment of FIG. 3. These signals serve merely as simple implementation examples, and actual signal waveforms may vary depending on implementation.

While the signals of FIG. 4 are example signals for the embodiment of FIG. 3, similar signals may be used in other embodiments, for example the embodiment of FIG. 1. The signals of FIG. 4 are voltage signals or current signals, shown in arbitrary units over time t.

A curve 40 shows an example for the enable signal EN, switching between the first state and the second state. In the example of FIG. 4, when the enable signal 40 is high, switch 35 is closed and switch 36 is open, and the device is therefore in the second state. When enable signal 40 is low, switch 36 is closed and switch 35 is open, and the device is in the first state. For ease of reference, in a line below the time axis in FIG. 4, the states are numbered, i.e. the first (leftmost in FIG. 4), second state is labelled 2.1, the first state following this is labelled 1.1, the next second state is labelled 2.2 etc., i.e., the first digit gives the state (first or second state), and the second digit numbers the respective state (first or second) consecutively.

A curve 41 illustrates the signal DAC output by the DAC 30 and buffer 31, 32, which may for example be tapped at terminal 37 and which is supplied to output terminal 38 and therefore to transistor 310 in the second state. In other words, DAC signal 41 determines the voltage applied to the gate terminal in the second state. In the example of FIG. 4, the DAC signal 41 is between a second voltage level V2 and a third voltage level V3, corresponding to the second and third voltage levels in the above explanations. The second voltage level V2 is higher than the first voltage level V3 by a difference voltage indicated by an arrow 44. Furthermore, in the example of FIG. 4, the second voltage V2 changes towards the third voltage V3 until the third voltage V3 is eventually reached with a linear slope as indicated by reference numeral 45. Both the difference 44 and the slope indicated by reference numeral 45 may be programmable. Moreover, while a linear transition from second voltage V2 to third voltage V3 is shown, in other embodiments non-linear waveforms may be used.

A curve 42 represents the signal Gate output at output terminal 38 and applied to the gate terminal of transistor 310. A curve 43 represents the drain current $I_{Drain}$.

In curve 42, the voltage VCLMP provided to terminal 39 represents a first voltage V1 in the sense explained above with reference to FIG. 1.

In the example of FIG. 4, at first the system is in the second state (state 2.1), which may be an active state, where the transistor is biased with voltage V3 and a drain current flows. Then, by switching the enable signal according to curve 40 to low, the system is brought to the first state (State 1.1. in FIG. 4), where the first voltage V1, i.e. VCLMP, is applied to the transistor. This sets the transistor to an inactive state, with the transistor being switched off or being set to a state with a higher impedance between source and drain terminals, resulting in a reduced drain current as shown by curve 43.

During the first state, 1.1 for example, the digital to analog converter is ramped up to provide an output signal at the second voltage level V2. As this ramping up to second voltage V2 is performed during the first state, i.e. when the voltage generated by digital to analog converter is not applied to the output terminal 38, this ramping up may be done comparatively slowly, or, in other words, no fast digital to analog converter is required.

When then at the end of first state 1.1 enable signal 40 goes high again, the voltage applied to the gate of the transistor according to curve 42 rises to the second voltage V2 provided by the digital to analog converter 30 via buffer 31, 32 and closed switch 35. By using the switching circuitry including switches 35, 36, the rise time from the first voltage V1 corresponding to VCLMP to the second voltage V2 may be made fast, for example below 10 µs, in particular below 5 µs or below 1 µs, or below 100 ns. As indicated by an arrow 37, the value of second voltage level V2 may be adjusted by adjusting the difference between the second voltage level V2 and the third voltage level V3, indicated by arrow 44. It should be noted that in some cases V2 may also be below V3.

Then, according to slope 45, as indicated by an arrow 46 the voltage provided at the output terminal to the gate, i.e. the control signal, according to curve 42 changes from second voltage level V2 to third voltage level V3. The duration of this transition may be above 1ops, for example above 0ops, and may reach the milliseconds range. The duration may be selected to compensate the above mentioned adverse effects like trapping effects, which decay over time, or self-heating effects, in which case the time duration may correspond to a time until a stable temperature of the transistor is reached.

Then, after the period indicated by arrow 46, the voltage provided to the gate terminal of the transistor remains at third voltage level V3.

With the difference between voltage levels V2, V3 and the slope 45, the voltage applied to the gate terminal of transistor 310 during the second state may be adjusted as indicated by an arrow 48 such that the drain current in the second state is always essentially at the same level, including a time indicated by an arrow 49 and corresponding to the time indicated by arrow 46. If only the third voltage V3 were applied, the drain current could behave for example as indicated by dotted lines for curve 43.

As already mentioned previously, in case the time where the device remains in the second state is comparatively short, it may happen that the third voltage level V3 is not reached. An example in FIG. 4 is the second state 2.3 where the device changes to the first state 1.3 before the third voltage level V3 is reached. Therefore, while also here the second voltage V2 in state 2.3 changes towards the third voltage level V3, it does not reach the third voltage level V3 before the device changes to the first state again.

Figure 5:
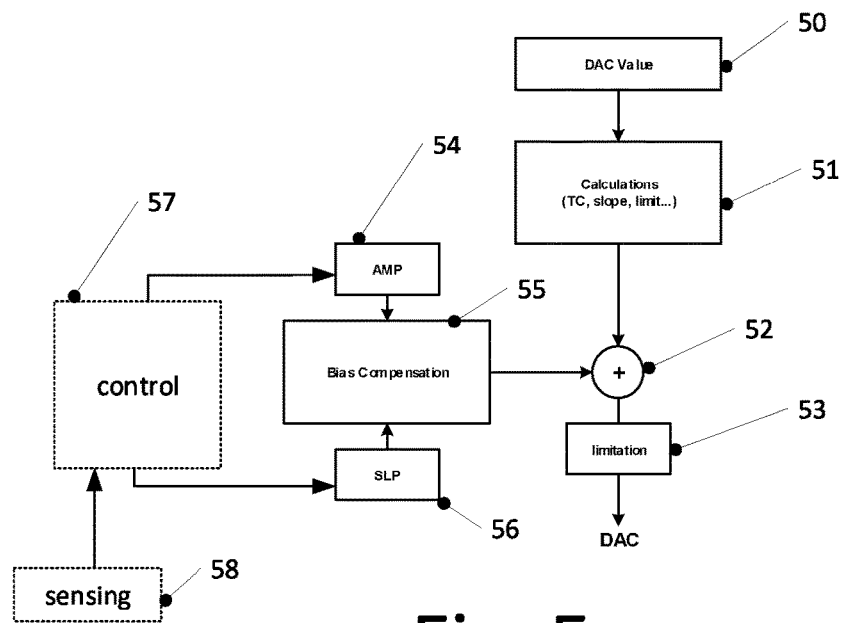
FIG. 5 is a diagram illustrating an embodiment of a control scheme.

In some embodiments, the difference between the second and third voltage levels indicated by arrow 44 or the time indicated by arrow 46 as determined by slope 45 may depend on the duration of the preceding first state. For example, when the transistor 310 is in the first state for a longer time, the effect of trapping may become more pronounced, and therefore, the difference 44 may be increased, and/or the duration indicated by arrow 46 may be increased, corresponding to a smaller slope 45. Corresponding values for the difference 44 (or values for the second and third voltage levels), slope 45 or other waveform information may be stored in a lookup table and read out depending on the time of the previous first state, which may be measured by a timer, or also other parameters like temperature. An example control is illustrated in FIG. 5. Furthermore, trapping effects may depend on the first voltage level V1. For example, for the polarities shown in FIGS. 3 and 4, a lower V1 may lead to a more pronounced trapping, and the value of V2 and hence the difference between V2 and V3 may be increased for lower values of V1 (for example more negative values) and may be decreased for higher values of V1. A lower value of V1 also corresponds to a higher difference between V1 and V3, such that the difference between V2 and V3 may also be set to higher values for higher differences between V2 and V1 and set to lower values. In a similar manner, also the other properties like slope or waveform mentioned above may be selected based on V1. The values for the difference between V2 and V3 or of other properties mentioned above depending on the time duration or depending on V1 may be determined by calibration measurements and stored e.g. in a lookup table.

The control of FIG. 5 may for example be implemented using a digital microcontroller programmed accordingly or an application specific integrated circuit (ASIC) or other dedicated circuitry. Therefore, the different blocks in FIG. 5 need not be implemented as separate devices, but may be implemented as a control flow in any digital circuitry.

The control device of FIG. 5 has a DAC value 50 stored therein. This DAC value 50 may be a base value for the third voltage V3. This base value may be modified by calculations 51 for example based on a temperature or other considerations, for example a current limit for a certain application, a desired slope at the operating point of the transistor and the like. In other embodiments, calculation 51 may be omitted.

The resulting value is added in an adder 52 to another value output by bias compensation 55. This value, in the example of FIG. 4, modifies the third voltage V3 for example to reach the second voltage V2 and to provide the slope 45. For this, at 54 the difference between the third and second voltage level (arrow 44 in FIG. 4) may be stored, and at 56 the slope may be stored. Bias compensation 55, based on these values, calculates the value to be added to the output of calculations 51.

In other embodiments, as also briefly explained referring to FIG. 4, the value stored at 54 and 56 may be modified by a control 57, based for example on sensor information obtained from sensing 58. Sensing 58 may for example include a timer measuring the duration of the first state as explained above, and modifying the value stored in 54 and 56 based on this time, for example using a lookup table. In other embodiments, sensing 58 may capture a temperature and also modify the stored values accordingly. Therefore, the second voltage level V2 and the changing to the third voltage level V3 are actively controlled by the device of FIG. 5.

At the output of Adder 52, a limitation 53 may limit the value if it exceeds a predefined threshold, for example to prevent that too high voltages are applied to the gate terminal of transistor 310. The output of limitation 53 is then provided as input to DAC 30.

Figure 6:
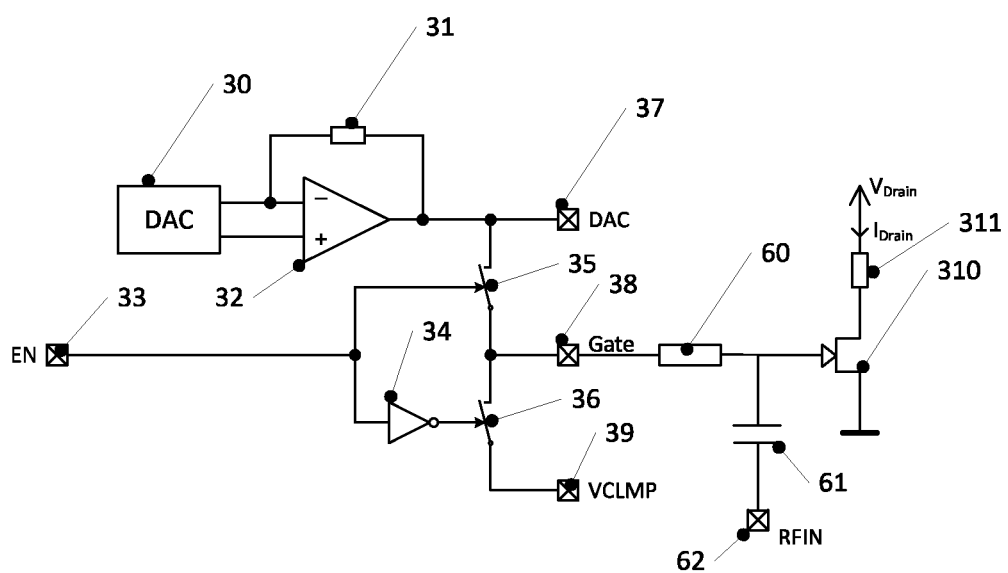
FIG. 6 is a circuit diagram of a device according to a further embodiment.

Devices as discussed herein may be used as amplifiers, for example radio frequency amplifiers. An example amplifier device is illustrated in FIG. 6. The device of FIG. 6 is a modification of the device of FIG. 3, and corresponding elements bear the same reference numerals and will not be described again.

In case of such an amplifier the first state explained above is an inactive state of the amplifier, and the second state discussed above is an active state where a radio frequency input signal RFIN provided at a terminal 62 in FIG. 2 is amplified. In some implementations, for example this may be used in a time division duplexing (TDD) communication system. In such an application, signal RFIN may be a signal to be amplified and then transmitted during transmission time slot of a TDD scheme. The first state (inactive state) then may be a state where the communication device receives signals, and the setting of transistor 310 to the second transistor state serves to reduce disturbances from the device of FIG. 6 to a receive path of the communication device.

In the device of FIG. 6, signal RFIN is provided to the gate terminal of transistor 310 via a capacitor 61. Capacitor 61 is a simple example for a high pass filter, which allows transmission of the radio frequency input signal RFIN, but blocks DC voltages. Additionally, in some implementation between output terminal 38 and the gate terminal of transistor 310 an impedance 60 (e.g., an inductor) may be provided, which serves as a simple example for a low pass filter, preventing coupling of any radio frequency disturbance signals to the gate of transistor 310. In the second state when switch 35 is closed, transistor 310 is set to a certain operating point, and then amplifies radio frequency signal RFIN, i.e. radio frequency signal RFIN modifies the drain current $I_{Drain}$ current accordingly. If load 311 is a resistor, for example, an amplified voltage signal may be tapped at the terminals of load 311. In other embodiments load 311 may represent further radio frequency circuitry which then transmits the amplified radio frequency signal.

Some further embodiments are defined by the following examples:

Example 1. A circuit for biasing a transistor, comprising:
an output terminal configured to be coupled to a control terminal of the transistor,
circuitry configured to selectively:
in a first state, output a control signal having a first voltage level at the output terminal for setting the transistor to a first transistor state, or
in a second state, output the control signal at the output terminal for setting the transistor to a second transistor state by first outputting the control signal at a second voltage level different from the first voltage level followed by changing the control signal from the second voltage level towards a third voltage level different from the first and second voltage levels over time, wherein the circuit is configured to select a difference between the second voltage level and the third voltage level based on at least one of a time duration of the first state prior to the second state or the first voltage level.

Example 2. The circuit of example 1, wherein a time duration between outputting the control signal with the second voltage level and outputting the control signal with the third voltage level is at least 10 µs.

Example 3. The circuit of example 1 or 2, wherein a time duration between outputting the control signal with the first voltage level at an end of the first state and outputting the control signal with the second voltage level at the beginning of the second state is less than 10 µs.

Example 4. The circuit of any one of examples 1 to 3, further comprising control circuitry configured to control the changing of the control signal from the second voltage towards the third voltage.

Example 5. The circuit of any one of examples 1 to 4, wherein at least one of a time duration between outputting the control signal with the second voltage level and outputting the control signal with the third voltage level, a slope of the control signal between the second voltage level and the third voltage level and a waveform of the control signal between the second voltage level and the third voltage level is configurable.

Example 6. The circuit of example 5, wherein the circuit is configured to select the at least one of the time duration between outputting the control signal with the second voltage level and outputting the control signal with the third voltage level, the slope of the control signal between the second voltage level and the third voltage level and the waveform of the control signal between the second voltage level and the third voltage level based on at least one of the time duration of the first state prior to the second state and the first voltage level.

Example 7. The circuit of any one of examples 1 to 6, wherein the circuit comprises a stored lookup table and is configured to perform the selecting based on the stored lookup table.

Example 8. The circuit of any one of examples 1 to 7, wherein the third voltage level is between the first voltage level and the second voltage level.

Example 9. The circuit of any one of examples 1 to 8, wherein the second voltage level is higher than the third voltage level.

Example 10. The circuit of any one of examples 1 to 9, wherein the circuitry comprises:
a bias voltage generator for generating the control signal in the second state, and
switching circuitry configured to couple the output terminal to the first voltage level in the first state and to the bias voltage generator in the second state.

Example 11. The circuit of example 10, wherein the bias voltage generator comprises a digital-to-analog converter.

Example 12. A device, comprising:
the circuit of any one of examples 1 to 1113, and
the transistor, wherein a control terminal of the transistor is coupled to the output terminal of the circuit.

Example 13. The device of example 12, further comprising a radio frequency input terminal coupled to the control terminal of the transistor via a high pass filter.

Example 14. The device of example 12 or 13, wherein the device is configured as an amplifier device, wherein the control signal in the second state determines the operating point of the transistor.

Example 15. The device of example 14, wherein the second voltage level is selected to at least partially compensate one of trapping effects or self-heating effects in the transistor.

Example 16. The device of example 14 or 15, wherein the second transistor state is an inactive state of the amplifier device.

Example 17. The device of any one of examples 12 to 16, wherein the transistor is a GaN transistor.

Example 18. A method for biasing a transistor, comprising, selectively:
in a first state, outputting a control signal to a control terminal of the transistor at a first voltage level for setting the transistor to a first transistor state, or
in a second state, for setting the transistor to a second transistor state, first outputting the control signal at a second voltage level different from the first voltage level followed by changing the control signal from the second voltage level to a third voltage level different from the first and second voltage levels over time,
the method further comprising selecting a difference between the second voltage level and the third voltage level based on at least one of a time duration of the first state prior to the second state or the first voltage level.

Example 19. The method of example 18, wherein a time duration between outputting the control signal with the second voltage level and outputting the control signal with the third voltage level is at least 10 µs.

Example 20. The method of example 18 or 19, wherein a time duration between outputting the control signal with the first voltage level at an end of the first state and outputting the control signal with the second voltage level at the beginning of the second state is less than 10 µs.

Example 21. The method of any one of examples 18 to 20, further comprising actively controlling the changing of the control signal from the second voltage towards the third voltage.

Example 22. The method of any one of examples 18 to 21, wherein at least one of a time duration between outputting the control signal with the second voltage level and outputting the control signal with the third voltage level, a slope of the control signal between the second voltage level and the third voltage level and a waveform of the control signal between the second voltage level and the third voltage level is configurable.

Example 23. The method of example 22, further comprising selecting the at least one of the time duration between outputting the control signal with the second voltage level and outputting the control signal with the third voltage level, the slope of the control signal between the second voltage level and the third voltage level and the waveform of the control signal between the second voltage level and the third voltage level based on at least one of the time duration of the first state prior to the second state or the first voltage level.

Example 24. The method of any one of examples 18 to 23, wherein the third voltage level is between the first voltage level and the second voltage level.

Example 25. The method of any one of examples 18 to 24, wherein the second voltage level is higher than the third voltage level.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit for biasing a transistor, comprising:
    an output terminal configured to be coupled to a control terminal of the transistor; and
    circuitry configured to selectively:
        in a first state, output a control signal having a first voltage level at the output terminal for setting the transistor to a first transistor state, and
        in a second state following the first state, output the control signal at the output terminal for setting the transistor to a second transistor state by first outputting the control signal at a second voltage level different from the first voltage level followed by changing the control signal from the second voltage level towards a third voltage level different from the first and second voltage levels over time, wherein the circuitry is configured to select a difference between the second voltage level and the third voltage level based on at least one of a time duration of the first state prior to the second state or the first voltage level.

2. The circuit of claim 1, wherein a time duration between outputting the control signal with the second voltage level and outputting the control signal with the third voltage level is at least 10 μs.

3. The circuit of claim 1, wherein a time duration between outputting the control signal with the first voltage level at an end of the first state and outputting the control signal with the second voltage level at a beginning of the second state is less than 10 μs.

4. The circuit of claim 1, further comprising control circuitry configured to control the changing of the control signal from the second voltage level towards the third voltage level.

5. The circuit of claim 1, wherein at least one of a time duration between outputting the control signal with the second voltage level and outputting the control signal with the third voltage level, a slope of the control signal between the second voltage level and the third voltage level and a waveform of the control signal between the second voltage level and the third voltage level is configurable.

6. The circuit of claim 5, wherein the circuitry is configured to select the at least one of the time duration between outputting the control signal with the second voltage level and outputting the control signal with the third voltage level, the slope of the control signal between the second voltage level and the third voltage level and the waveform of the control signal between the second voltage level and the third voltage level based on at least one of the time duration of the first state prior to the second state or the first voltage level.

7. The circuit of claim 1, wherein the third voltage level is between the first voltage level and the second voltage level.

8. The circuit of claim 1, wherein the circuitry comprises:
    a bias voltage generator for generating the control signal in the second state; and
    switching circuitry configured to couple the output terminal to the first voltage level in the first state and to the bias voltage generator in the second state.

9. The circuit of claim 8, wherein the bias voltage generator comprises a digital-to-analog converter.

10. A device, comprising:
    the circuit and transistor of claim 1, wherein the control terminal of the transistor is coupled to the output terminal of the circuit.

11. The device of claim 10, wherein the device is configured as an amplifier device, wherein the control signal in the second state determines an operating point of the transistor.

12. The device of claim 11, wherein the second voltage level is selected to at least partially compensate one of trapping effects or self-heating effects in the transistor.

13. The circuit of claim 1, wherein the second voltage level is configured to cause the transistor to conduct a first current, and the third voltage level is configured to cause the transistor to conduct a second current, wherein the second current is higher than the first current.

14. The device of claim 10, wherein the transistor is a GaN transistor.

15. The circuit of claim 7, wherein the circuitry is configured to set the difference between the second voltage level and the third voltage level based on at least one of the time duration of the first state prior to the second state or the first voltage level.

16. A method for biasing a transistor, comprising, selectively:
    in a first state, outputting a control signal to a control terminal of the transistor at a first voltage level for setting the transistor to a first transistor state; and
    in a second state following the first state, for setting the transistor to a second transistor state, first outputting the control signal at a second voltage level different from the first voltage level followed by changing the control signal from the second voltage level to a third voltage level different from the first and second voltage levels over time, wherein the method further comprises selecting a difference between the second voltage level and the third voltage level based on at least one of a time duration of the first state prior to the second state or the first voltage level.

17. The method of claim 16, wherein at least one of
a time duration between outputting the control signal with the second voltage level and outputting the control signal with the third voltage level,
a slope of the control signal between the second voltage level and the third voltage level, or
a waveform of the control signal between the second voltage level and the third voltage level is configurable.

18. The method of claim 16, wherein the second voltage level causes the transistor to conduct a first current, and the third voltage level causes the transistor to conduct a second current, wherein the second current is higher than the first current.

19. A circuit comprising:
a voltage generator configured to provide, at an output, a voltage signal that starts at an initial voltage and transitions to a final voltage during a transition phase of an active mode, wherein a difference between the initial voltage and the final voltage is based on a length of a time period of an inactive mode preceding the active mode;
a first switch having a load path coupled between the output of the voltage generator and a bias node configured to be coupled to a control node of a transistor; and
a second switch having a load path coupled between a clamp node configured to receive a clamp voltage and the bias node, wherein:
during the active mode, the first switch is configured to be on and the second switch is configured to be off, and
during the inactive mode, the first switch is configured to be off, and the second switch is configured to be on.

20. The circuit of claim 19, wherein the voltage generator a digital-to-analog converter.

21. The circuit of claim 19, further comprising the transistor.

* * * * *

UNITED STATES PATENT AND TRADEMARK OFFICE
CERTIFICATE OF CORRECTION

PATENT NO. : 12,368,413 B2
APPLICATION NO. : 18/172008
DATED : July 22, 2025
INVENTOR(S) : Wappis et al.

Page 1 of 1

It is certified that error appears in the above-identified patent and that said Letters Patent is hereby corrected as shown below:

In the Claims

In Column 14, in Claim 20, Line 18, after "generator" insert -- comprises --.

Signed and Sealed this
Fourteenth Day of October, 2025

John A. Squires
*Director of the United States Patent and Trademark Office*